United States Patent [19]

Chen

[11] 4,329,016
[45] May 11, 1982

[54] OPTICAL WAVEGUIDE FORMED BY DIFFUSING METAL INTO SUBSTRATE

[75] Inventor: Bor-Uei Chen, Northridge, Calif.

[73] Assignee: Hughes Aircraft Company, Culver City, Calif.

[21] Appl. No.: 78,106

[22] Filed: Sep. 24, 1979

Related U.S. Application Data

[62] Division of Ser. No. 911,543, Jun. 1, 1978, Pat. No. 4,206,251.

[51] Int. Cl.³ .............................................. G02B 5/14
[52] U.S. Cl. .............................. 350/96.12; 427/126.2; 427/126.3; 427/108; 427/100; 427/167; 427/383.5
[58] Field of Search ................... 350/96.12; 427/126.2, 427/126.3, 108, 100, 167, 383.5

[56] References Cited

U.S. PATENT DOCUMENTS

| | | | |
|---|---|---|---|
| 3,163,553 | 12/1964 | Commanday | 427/383 D |
| 3,806,223 | 4/1974 | Keck et al. | 360/96.12 |
| 3,834,939 | 9/1974 | Beyer | 427/85 |
| 3,877,982 | 4/1975 | Coldren | 427/100 |
| 3,928,225 | 12/1975 | Schäfe | 427/85 |
| 3,947,087 | 3/1976 | Furuta et al. | 350/96.12 |
| 3,964,085 | 6/1976 | Kahng | 427/85 |
| 4,017,291 | 4/1977 | Gliemeroth | 65/30 R |
| 4,032,217 | 6/1977 | Coeure' et al. | 350/96.12 |
| 4,038,111 | 7/1977 | Dumar | 427/85 |
| 4,048,350 | 9/1977 | Glang | 427/85 |
| 4,087,315 | 5/1978 | Aurache et al. | 350/96.12 |
| 4,136,439 | 1/1979 | Aurache et al. | 350/96.12 |
| 4,179,189 | 12/1979 | Kaminow et al. | 350/96.12 |
| 4,232,062 | 11/1980 | Okino et al. | 427/160 |

OTHER PUBLICATIONS

Mikami et al., "Phase Tuning . . . Film", *Applied Physics Letters*, vol. 31, No. 6, Sep. 15, 1977.
Findakly et al., "Optical Directional . . . Spacing", *Applied Optics*, vol. 17, No. 5, Mar. 1, 1978.
Minakata et al., "LiNbTa$_{1-x}$O$_3$ . . . Sputtered Films", App. Physics Letters, vol. 26, No. 7, pp. 395-398 (4/1975).
Burns et al., "Application of LiO . . . Waveguides", App. Physics Letters, Jul. 1978, vol. 33(1), pp. 70-72.
Tien, Review of Modern Physics, vol. 49, No. 2, Apr. 1977.
Findakly et al., Applied Optics, vol. 17, No. 3, Feb. 1978.

*Primary Examiner*—Norman Morgenstern
*Assistant Examiner*—Richard Bueker
*Attorney, Agent, or Firm*—Mary E. Lachman; W. H. MacAllister

[57] ABSTRACT

The specification describes an optical waveguide device formed by diffusing a metal into a substrate which may be either a semiconductor material or a dielectric material. The substrate is first coated with a liquid composition comprising organo-metallic solutions of the desired metal and silica. The coated substrate is then heated at an elevated temperature for a period of time sufficient to cause the organic portion of the solution to decompose, thereby leaving a composite film comprising an oxide of the desired metal and SiO$_2$. Upon further heating, the metal from the metal oxide diffuses into the substrate. The residual composite film may be left in place or removed.

1 Claim, 4 Drawing Figures

OPTICAL WAVEGUIDE FORMED BY DIFFUSING METAL INTO SUBSTRATE

This application is a division of application Ser. No. 911,543, filed June 1, 1978 now U.S. Pat. No. 4,206,251.

FIELD OF THE INVENTION

The invention relates generally to a process for diffusing a metal into a substrate consisting of either a semiconductor material or a dielectric material and an optical waveguide device formed thereby. More particularly, the invention relates to a process for diffusing titanium into $LiNbO_3$ crystals to form a single mode optical waveguide in which $Li_2O$ out-diffusion has been prevented.

BACKGROUND OF THE INVENTION AND RELATED APPLICATION

In optical communication systems, messages are transmitted by carrier waves of optical frequencies that are generated by sources such as lasers or light-emitting diodes. There is much current interest in such optical communication systems because they offer several advantages over conventional communication systems, such as a greatly increased number of channels of communication and the ability to use other materials besides expensive copper cables for transmitting messages. One such means for conducting or guiding waves of optical frequencies from one point to another is called an "optical waveguide". The operation of an optical waveguide is based on the fact that when a medium which is transparent to light is surrounded or otherwise bounded by another medium having a lower refractive index, light introduced along the inner medium's axis is totally reflected at the boundary with the surrounding medium, thus producing a guiding effect.

Certain electro-optical materials are very attractive for this application since they make it possible to achieve electrical control and high-speed operation of electro-optical devices and circuits. The use of lithium niobate ($LiNbO_3$) crystals for such purposes is well-known in the art, and is disclosed, for example, in an article entitled "Integrated Optics and New Wave Phenomenon in Optical Waveguides," P. K. Tien, in *Reviews of Modern Physics*, Vol. 49, No. 2 (1977), pages 361–420. Lithium niobate has large electro-optic and acousto-optic coefficients and provides low loss propagation of light within waveguide layers or other regions within this material. Many different types of active channel waveguide devices using these materials have been used in a variety of electro-optical modulators and switches which are compatible with single-mode optical fibers.

Various methods of forming high refractive index waveguides in $LiNbO_3$ have been used in the art. They include: epitaxial growth by sputtering, epitaxial growth by melting, lithium oxide ($Li_2O$) out-diffusion, and transition metal in-diffusion. Epitaxial growth by sputtering often leads to films with high losses and poor electro-optical properties. In epitaxial growth by melting, the film thickness cannot be easily controlled. The $Li_2O$ out-diffusion process generates a film which can support only TE polarization waves (polarization parallel to the surface of the waveguide structure) propagating along the X axis on a Y-cut wafer.

The in-diffusion of a transition metal, such as titanium, nickel, or vanadium, into $LiNbO_3$ offers a promising technique to produce planar as well as channel waveguide structures. The in-diffusion process involves evaporating a layer of metal, such as titanium, onto the surface of the crystal substrate by electron-beam sputtering techniques such as those described by K. L. Chopra, "Thin Film Phenomena," Chapter 2, McGraw-Hill Book Company, New York, 1969. The metal is then diffused at an elevated temperature, such as 900° C., for an extended period of time (e.g., 6 hours). Typically, by this prior art method, a sample is cleaned and placed in a vacuum chamber which is evacuated to a pressure of $10^{-8}$ torr. Then, using an expensive and complex electron beam evaporation apparatus, titanium is evaporated onto the surface of the sample. These evacuation and evaporation procedures are time-consuming, requiring typically 4 hours to complete. Thus, the prior art process has the disadvantages of requiring expensive and complex apparatus, requiring the maintenance of a vacuum, and being time consuming.

In addition to the problems of implementing the above described prior art process, another serious problem arises because at the high temperature required for metal in-diffusion, loosely bound $Li_2O$ diffuses out from the surface of the crystal structure. As a result of this $Li_2O$ out-diffusion, a $Li_2O$-deficient planar waveguide layer is formed in the $LiNbO_3$ crystal in addition to the waveguides formed by metal in-diffusion. The waveguide formed by out-diffusion can confine TE polarization waves propagating along the X-axis on a Y-cut wafer (or the Y-axis on an X-cut wafer) in an undesirable manner. (A Y-cut wafer is a wafer cut perpendicular to the Y-axis of the crystal. For a more detailed description of crystal cutting, refer to "Standards on Piezoelectric Crystals, 1949," *Proceedings of the Institute of Radio Engineers*, pp. 1378–1395, December 1949). In a channel wave-guide device, a planar out-diffusion waveguide introduces excessive cross-talk between guided modes from two adjacent waveguides. Cross-talk presents particular difficulties when trying to achieve compatibility between a fiber optic communications link and optical channel waveguide switches based on controlled coherent coupling. The planar index increase caused by the out-diffusion of $Li_2O$ limits the implementation of the coherent coupling switches to TM waveguide modes only (i.e., polarization perpendicular to the surface of the waveguide structure). In addition, in an end-butt coupling configuration between a single mode optical fiber and a channel waveguide, a large portion of the optical energy goes to the unwanted out-diffusion modes, which are readily excited by the optical fiber input, and thus the coupling to the channel waveguide is effectively diminished.

The cause of the out-diffusion of $Li_2O$ from $LiNbO_3$ crystals is inherent in the particular structure of these crystals. It is well known that $LiNbO_3$ crystals can be grown in a slightly non-stoichiometric form, $(Li_2O)_v(Nb_2O_5)_{1-v}$ where v ranges from 0.48 to 0.50. At the high temperature (850° C. to 1200° C.) required for the in-diffusion of transition metal ions in order to form a waveguide in $LiNbO_3$ crystals, the loosely bound $Li_2O$ diffuses out from the surface of the crystal. It is known experimentally that for a small change of v in $LiNbO_3$, the ordinary refractive index remains unchanged while the extraordinary refractive index increases approximately linearly as v decreases. The reduction in the $Li_2O$ concentration at the surface of the crystal due to out-diffusion thus forms a high-index layer which traps optical beams in the direction perpendicular to the surface of the waveguide structure.

One method for suppressing the out-diffusion of $Li_2O$ from $LiNbO_3$ and $LiTaO_3$ waveguide structures is disclosed in U.S. Pat. 4,196,963, assigned to the present assignee and includes exposing the $LiTaO_3$ and $LiNbO_3$ crystal structures to a $Li_2O$-rich environment at sufficient vapor pressure that $Li_2O$ diffuses into the structure as a compensation process and a solid-solid surface interaction occurs. The $Li_2O$-rich environment is obtained by annealing the structure in a high purity powder of $LiNbO_3$ or $LiTaO_3$ or in molten $LiNO_3$.

The invention described in this copending application is highly effective in suppressing $Li_2O$ out-diffusion from $LiNbO_3$ and $LiTaO_3$ crystals. However, the present invention provides still other novel and alternative means for preventing $Li_2O$ out-diffusion in selected waveguide materials. In addition, the present invention provides an improved method for diffusing a metal into a substrate to form a waveguide structure, which overcomes many of the disadvantages of certain prior art processes.

SUMMARY OF THE INVENTION

The general purpose of this invention is to provide a new and improved method for diffusing a metal into a substrate, and more particularly a method for forming a Ti-diffused $LiNbO_3$ optical waveguide. More specifically, the present invention provides a new and improved means and method for diffusing Ti into a $LiNbO_3$ crystal substrate to form a waveguide structure, while simultaneously preventing the out-diffusion of $Li_2O$ from the crystal substrate.

In order to accomplish this purpose, I have discovered and developed, among other things, a novel process in which a substrate is first coated with a liquid composition comprising organo-metallic solutions of the desired metal. (The term "organo-metallic" is used herein to refer to a substance whose molecules contain a carbon-metal linkage). The coated substrate is then heated at an elevated temperature for a period of time sufficient to cause the organic portion of the solution to decompose, thereby leaving a composite film comprising an oxide of the desired metal and $SiO_2$. Upon further heating, the metal from the metal oxide diffuses into the substrate.

More specifically, I have discovered and developed a novel process in which a sample of $LiNbO_3$ crystals is coated with an organo-metallic titanium-silica film and heated at an elevated temperature for a period of time sufficient to cause the organic material to decompose into $CO_2$ and $H_2O$, leaving a composite film comprising $TiO_2$ and $SiO_2$, and to cause Ti diffusion into the substrate to occur. The Ti from the $TiO_2$ in the composite film diffuses into the $LiNbO_3$ crystal to form a Ti-diffused $LiNbO_3$ optical waveguide. Simultaneously, the composite film prevents the out-diffusion of $Li_2O$ from the crystal, which usually occurs at elevated temperatures.

The present invention overcomes many of the disadvantages of the expensive, complex, and time-consuming prior art process previously discussed. The present invention is relatively simple, fast, and inexpensive in its implementation. The titanium-silica film may be easily applied by known dip-coating techniques which are practiced in the integrated electronics processing industry or by a spin coating technique such as that described by W. S. DeForest, "Photoresist: Materials and Processes," Chapter 7, McGraw-Hill, New York, 1975. In addition, the present invention provides a high purity source of Ti, and further, the proportions of $TiO_2$ and $SiO_2$ therein may be varied as desired in order to obtain the appropriate Ti concentration.

As an additional advantage, the present invention provides a film on the surface of the crystal which prevents the diffusion of $Li_2O$ out of the crystal. Furthermore, in practicing the present invention, the $Li_2O$ out-diffusion is automatically eliminated without requiring a separate process specifically directed to that end. As previously disclosed, this $Li_2O$ out-diffusion is the cause of many difficulties in the formation of optical waveguides and its elimination is highly desirable. In accordance with the present invention, the prevention of the $Li_2O$ out-diffusion from $LiNbO_3$ waveguide structures prevents the formation of unwanted waveguide modes and the associated problem of excessive cross-talk between guided modes. Further, the present invention enables efficient end-butt coupling between a single mode optical fiber and a channel waveguide to be achieved. In addition, by optimizing both the TE and TM polarizations in the optical waveguides thus produced, the present invention eliminates polarization control requirements for the fabrication of fiber optic waveguides and thus eliminates or minimizes the need for polarizers in the optical transmission line.

A noteworthy feature of the present invention is that after the optical waveguide has been formed, the composite residual film may be left in place to provide a required isolation or passivation layer for the waveguide and thus eliminating any additional processing steps required to form such a layer.

Accordingly, it is an object of the present invention to provide a new and improved optical waveguide device formed by diffusing a metal into a selected substrate.

A further object is to provide a new and improved optical waveguide device formed by diffusing Ti into a $LiNbO_3$ crystal substrate.

Another object is to provide a new and improved optical waveguide device formed by in-diffusing Ti into a $LiNbO_3$ substrate while simultaneously preventing $Li_2O$ out-diffusion from the substrate.

Still another object is to provide a new and improved Ti-diffused $LiNbO_3$ single mode optical waveguide in which the formation of an unwanted planar waveguide is prevented.

An additional object is to provide a high purity source of Ti for diffusion.

Another object is to provide a simple, fast, and inexpensive process for diffusing a metal into a selected substrate.

A feature of this invention is the provision of a novel composite semiconductor-metal-dielectric optical waveguide structure wherein the dielectric layer, e.g. $TiO_2:SiO_2$, is multi-functional in that it serves to prevent $Li_2O$ out-diffusion from the semiconductor and also passivates, protects and enhances optical waveguiding in the metal waveguide layer.

These and other objects and features of the invention will become more readily apparent in the following description of the preferred embodiment.

DESCRIPTION OF THE PREFERRED EMBODIMENTS

Figure 1A:
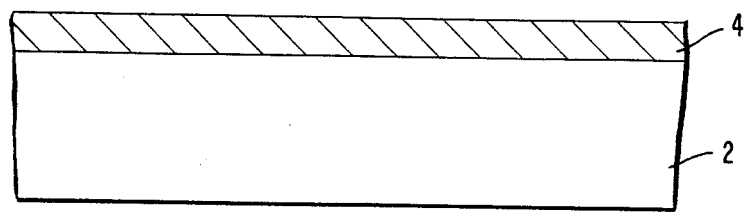
FIGS. 1a–1d illustrate in schematic cross-section some of the major steps in the process of the present invention.

Referring now to FIG. 1a, there is shown a wafer 2 of LiNbO$_3$ crystals upon which has been deposited a film 4 of a liquid composition comprising organo-metallic solutions of Ti and silica. The film 4 is deposited by known spin-coating techniques wherein, for example, a plurality of LiNbO$_3$ substrates are mounted on a suitable support table, provided with a few drops of the organo-metallic Ti-silica solution and then rotated with circular rotational speed sufficient to centrifugally spin the Ti-silica solution uniformly and radially across the upper surfaces of the substrates. Then, the LiNbO$_3$ substrates are allowed to dry before processing is resumed. Optionally, the whole wafer 2 may be dip-coated with the Ti-silica solution, in which case the layer 4 is deposited on all sides of the wafer.

Figure 1B:
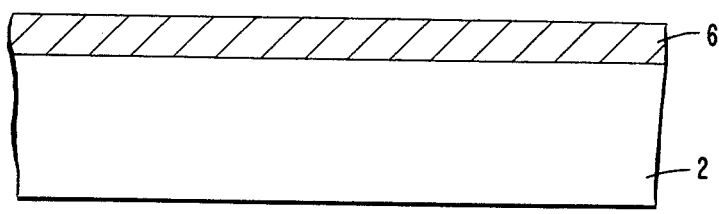
Figure 1C:
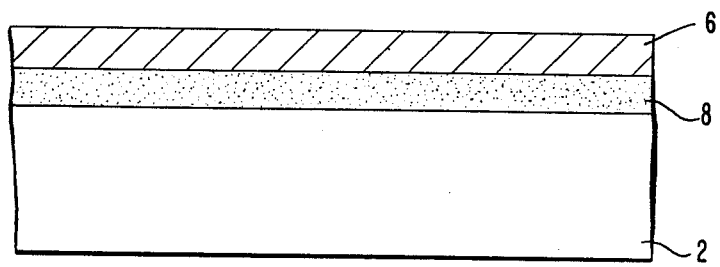
Figure 1D:
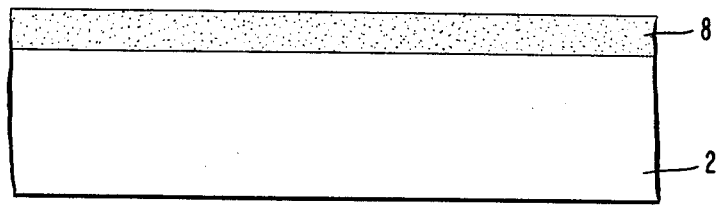

The structure of FIG. 1a is then heated at 600° C. for 4 hours to allow the organo-metallic film to decompose and leave a composite TiO$_2$-SiO$_2$ solid film 6 shown in FIG. 1b. Next, the structure of FIG. 1b is heated at 950° C. for 16 hours in a flowing oxygen atmosphere to allow the Ti to diffuse into the LiNbO$_3$ wafer. The resulting waveguide structure, shown in FIG. 1c, consists of the LiNbO$_3$ wafer 2 into which Ti has diffused to form layer 8, with the residual TiO$_2$-SiO$_2$ film 6 on the surface of the wafer. Optionally, the residual TiO$_2$-SiO$_2$ film 6 of FIG. 1c may be removed with dilute hydrofluoric acid, to provide the waveguide structure of FIG. 1d, consisting of the LiNbO$_3$ wafer 2 into which Ti has diffused to form layer 8.

In practicing the present invention, a Y-cut LiNbO$_3$ crystal, 1 inch by 1 inch, was dip-coated at a pulling speed of 0.25 inches per minute with an organo-metallic liquid having the trade name "TITANIUM-SILICAFILM B", purchased from Emulsitone Company, Whippany, N.J. The TITANIUMSILICAFILM B is a liquid composition comprising organo-metallic solutions of Ti and silica and is a high purity source of Ti which contains the following low impurities: <0.5 ppm of Fe; <1 ppm of Cu; and <1 ppm of Na. The coated crystal was then placed in a high temperature furnace and heated at 600° C. for 4 hours. When heated, the organo-metallic film decomposed, leaving a composite TiO$_2$-SiO$_2$ solid film, consisting of about 72% TiO$_2$ and about 28% SiO$_2$ and having a thickness of about 1150 angstroms. The coating was very uniform in thickness except for the edges, where a thinner coating was obtained. Next, the sample was heated at 950° C. for 16 hours in a flowing oxygen atmosphere, which caused Ti-diffusion into the LiNbO$_3$ crystal to occur. The residue film on the surface was etched away readily with diluted (30%) HF. It was observed that the area coated with TITANIUMSILICAFILM had expanded in volume and been raised by about 200 Å. According to past experience with diffusion of electron beam evaporated Ti, the resulting diffusion area would raise by 2.5 times to the original Ti film thickness. A 200 Å increase indicates that the amount of Ti metal diffused into the LiNbO$_3$ substrate is equivalent to an 80 Å thick pure Ti coating.

The resulting waveguide had a very good surface appearance. One TE mode and one TM mode had been successfully excited in the waveguide using a He-Ne laser and TiO$_2$ prism couplers, in the manner described by P. K. Tien, R. Ulrich, and R. J. Martin, "Modes of Propagating Light Waves in Thin-Deposited Semiconductor Films," in *Applied Physics Letters*, Vol. 14, p. 291 (1969). The guided optical beams propagated along the X-axis so that the TE and TM modal indices were determined by the index change in the extraordinary axes respectively.

In addition, no Li$_2$O out-diffusion mode was observed. The waveguide loss was measured using a two-prism coupler. The first prism coupled TE polarization He-Ne laser light into the waveguide and the second prism extracted the guided light to a detector. By monitoring the output as a function of the prism separation, the waveguide loss was determined from the slope of a semi-logarithmic plot. The waveguide loss was calculated to be 1.6 dB/cm.

It is not necessary that the residue film on the crystal surface be etched away. In fact, in certain applications it would be desirable to retain this film. Such is the case in the formation of an active waveguide, such as a light modulator, in which a metallic electrode is used and must be isolated from the optical waveguide itself in order to avoid scattering and absorption losses. The residue film in the present invention can provide this type of isolation, as well as providing a passivation layer.

While the invention has been particularly described with respect to the preferred embodiment thereof, it will be recognized by those skilled in the art that certain modifications in form and detail may be made without departing from the spirit and scope of the invention. In particular, the scope of the invention is intended to include the diffusion of any metal which is capable of forming an organo-metallic solution, including both transition metals such as Ti and ordinary metals. Further, the present invention includes the diffusion of a metal into various substrates, which may be semiconductor materials or dielectric materials. More specifically, where the present invention discusses LiNbO$_3$ crystals in particular, it is expected that LiTaO$_3$ crystals will function in the same manner when treated with the above inventive process.

What is claimed is:

1. An optical waveguide structure wherein a lithium niobate (LiNbO$_3$) substrate has a titanium-diffused waveguiding layer therein atop which is disposed a dielectric layer comprising a composite film of titanium oxide and silicon dioxide, formed by a process comprising the deposition and subsequent thermal decomposition of an organo-metallic titanium-silica film on a surface of said lithium niobate substrate to thereby diffuse said titanium into said substrate and form said dielectric layer and simultaneously prevent unwanted out-diffusion of lithium oxide (Li$_2$O) from said substrate, whereby the optical waveguiding properties of said waveguide are enhanced.

* * * * *